(12) United States Patent
Behringer et al.

(10) Patent No.: US 7,260,129 B2
(45) Date of Patent: Aug. 21, 2007

(54) MULTIPARTITE LASER

(75) Inventors: Martin Behringer, Regensburg (DE); Franz Eberhard, Regensburg (DE); Johann Luft, Wolfsegg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 301 days.

(21) Appl. No.: 10/774,727

(22) Filed: Feb. 9, 2004

(65) Prior Publication Data
US 2004/0161008 A1 Aug. 19, 2004

Related U.S. Application Data

(63) Continuation of application No. PCT/DE02/02828, filed on Aug. 1, 2002.

(30) Foreign Application Priority Data
Aug. 9, 2001 (DE) ................ 101 39 090

(51) Int. Cl.
*H01S 5/00* (2006.01)
(52) U.S. Cl. ............... 372/45.01; 372/26; 372/30
(58) Field of Classification Search ............. 372/75, 372/45.01, 26, 30
See application file for complete search history.

(56) References Cited

U.S. PATENT DOCUMENTS

| 4,622,671 A | 11/1986 | Tsang | |
|---|---|---|---|
| 4,805,185 A * | 2/1989 | Smith | 372/97 |
| 5,136,598 A * | 8/1992 | Weller et al. | 372/26 |
| 5,220,572 A * | 6/1993 | Kawaguchi | 372/30 |
| 5,544,188 A * | 8/1996 | Takiguchi et al. | 372/45.01 |
| 5,568,498 A | 10/1996 | Nilsson | |
| 5,856,990 A | 1/1999 | Nilsson | |

(Continued)

FOREIGN PATENT DOCUMENTS

DE 196 13 755 A1 10/1997

(Continued)

OTHER PUBLICATIONS

Gosh, Gorachand et al. "Temperature dispersion of refractive indices of BK7 and SF6 glasses" Lasers and Electro-Optics, 1997. CLEO/Pacific Rim 97. pp. 197-198.*

(Continued)

*Primary Examiner*—Dung (Michael) T. Nguyen
(74) *Attorney, Agent, or Firm*—Laurence A. Greenberg; Werner H. Stemer; Ralph E. Locher

(57) ABSTRACT

A device for emission of laser radiation includes at least one semiconductor laser having a resonator and a pumped active zone disposed within the resonator. The zone is subdivided into at least two spatially separated active zones by free-radiation regions without lateral wave guidance. Preferably, the laser is at least two semiconductor lasers disposed in series, a row, or a line, each having an antireflection coating on at least one side. The lasers have outer mirror elements at an end of the lasers disposed in series and the outer mirror elements form the resonator. A laser configuration includes two opposite semiconductor lasers from which a fundamental mode is in each case imaged into the active zone of the opposite semiconductor laser. The laser configuration has an emerging laser beam with little divergence.

21 Claims, 2 Drawing Sheets

U.S. PATENT DOCUMENTS

| | | | |
|---|---|---|---|
| 5,879,961 A | 3/1999 | Scott | |
| 6,263,002 B1 * | 7/2001 | Hsu et al. | 372/6 |
| 6,263,140 B1 * | 7/2001 | Stegmuller | 385/131 |
| 6,483,161 B1 * | 11/2002 | Kuhara et al. | 257/433 |

FOREIGN PATENT DOCUMENTS

| | | |
|---|---|---|
| EP | 0 516 263 A2 | 12/1992 |
| JP | 56006492 | 1/1981 |
| WO | 91/02391 | 2/1991 |
| WO | 97/30495 | 8/1997 |
| WO | WO9730495 A1 * | 8/1997 |

OTHER PUBLICATIONS

Marcano, A. et al. "High-sensitivity absorption measurement in water and glass samples using a mode-mismatched pump-probe thermal lens method" Applied Physics Letters, vol. 78 No. 22, 2001, pp. 3415-3417.*

Raj, M. M. et al.: "Theoretical Analysis of GaInAsP/InP Multiple Micro-Cavity Laser", The Japan Society of Applied Physics, vol. 39, Part 1, No. 10, Oct. 2000, pp. 5847-5854.

Getty, J. T. et al.: "Monolithic Series-Connected 1.55μm Segmented-Ridge Lasers", Electronic Letters, vol. 35, No. 15, Jul. 22, 1999, pp. 1257-1258.

Raj, M. M. et al.: "Multiple Micro-Cavity Laser with N4-Wide Deep Grooves Buried with Benzocyclobutene", 11th International Conference on Indium Phosphide and Related Materials, IEEE, May 6-20, 1999, pp. 207-210.

Liew, S. K. et al.: "Coherent Continuous Wave Operation 10X10X2 Grating-Surface-Emitting Diode Laser Array in a Ring Configuration", Journal of Applied Physics 70, American Institute of Physics, No. 12, Dec. 15, 1991, pp. 7645-7647.

Carlin, J. F. et al.: "The Dual Wavelength Bi-Vertical Cavity Surface-Emitting Laser", Applied Physics Letters, American Institute of Physics, vol. 75, No. 7, Aug. 16, 1999, pp. 908-910.

Evans, G. A. et al.: "Characteristics of Coherent Two-Dimensional Grating Surface Emitting Diode Laser Arrays During CW Operation", IEEE Journal of Quantum Electronics, vol. 27, No. 6, Jun. 1991, pp. 1594-1608.

* cited by examiner

MULTIPARTITE LASER

CROSS-REFERENCE TO RELATED APPLICATION

This application is a continuation of copending International Application No. PCT/DE02/02828, filed Aug. 1, 2002, which designated the United States.

BACKGROUND OF THE INVENTION

Field of the Invention

The invention relates to a device for emission of laser radiation with one or a plurality of pumped active zones of a semiconductor laser, the zones being disposed within a resonator.

Semiconductor lasers are generally known and are usually produced in two embodiments. In the case of edge-emitting laser diodes, the emission is effected in the direction of extent of the pumped active layer and the laser radiation emerges through the edges of the active layer. This type of laser diodes generally exhibits poor beam quality because the edge-emitting laser does not oscillate in one mode and does not oscillate exclusively in the fundamental mode. Thus, the laser radiation is emitted in a wide angular range. This is a pronounced problem particularly in the case of edge-emitting laser diodes whose active zone has a large extent transversely with respect to the optical axis of the resonator.

In addition to the edge-emitting laser diodes, surface-emitting diodes are also known, in which the laser radiation is emitted at right angles to the pumped active layer. The surface-emitting laser diodes are afflicted, on one hand, with high electrical resistances based on the limited dopability of mirror layers formed on both sides of the active zones. Although the resistances can also be reduced, inter alia, by increasing the diameter of the active zone, this generally has the effect that higher modes start during the operation of the laser, which modes impair the beam quality.

SUMMARY OF THE INVENTION

It is accordingly an object of the invention to provide a multipartite laser that overcomes the hereinafore-mentioned disadvantages of the heretofore-known devices of this general type and that provides a device for emission of laser radiation of high power with a good beam quality.

With the foregoing and other objects in view, there is provided, in accordance with the invention, a device for emission of laser radiation, including at least one semiconductor laser having a resonator and a pumped active zone disposed within the resonator, the zone being subdivided into at least two spatially separated active zones by free-radiation regions without lateral wave guidance.

According to the invention, the active zone is subdivided into at least two spatially separated active zones by free-radiation regions without lateral wave guidance.

What is achieved by the spatial separation of the two pump zones is that only the fundamental mode in each case couples into the respective other pump zone and is, thereby, amplified or the fundamental mode couples in significantly more effectively than all the other modes. This is because the remaining modes radiate at solid angles that are significantly greater than the solid angle at which the opposite pump zone appears from the respective pump zone and, consequently, these higher modes are not amplified in the other pump zone. These higher modes, thus, experience a smaller amplification per resonator circulation than the fundamental mode and, therefore, do not exceed the laser threshold given a corresponding electrical pump power.

In accordance with another feature of the invention, the at least one semiconductor laser is at least two semiconductor lasers, the semiconductor lasers have at least one end, are disposed in series, a row, or a line, and have sides and an antireflection-coating at least on one of the sides, the semiconductor lasers have outer mirror elements at the end of the semiconductor lasers disposed in series, and the outer mirror elements forms the resonator.

In accordance with a further feature of the invention, the device has a series, a row, or a line of broad-stripe lasers, whose resonator is formed by the outer mirror areas of the broad-stripe lasers disposed at the end.

The problem of higher-order modes starting to oscillate is particularly pronounced in the case of the broad-stripe lasers. It is advantageous, therefore, to dispose a series, a row, or a line of broad-stripe lasers at a distance from one another to ensure that only a fundamental mode in each case starts to oscillate or the proportion of higher modes is, thereby, significantly reduced and the beam quality is, thus, correspondingly improved.

In accordance with an added feature of the invention, the semiconductor lasers are two broad-stripe lasers disposed at a distance from one another and have antireflection-coated end faces facing one another.

In accordance with an additional feature of the invention, there is provided a substrate. The lasers are formed on the substrate.

In accordance with yet another feature of the invention, the semiconductor lasers have optical axes and the semiconductor lasers are oriented with the optical axes parallel to one another.

In accordance with yet a further feature of the invention, the semiconductor lasers are disposed from one another at a distance between approximately 1µm and approximately 10 m.

In accordance with yet an added feature of the invention, there is provided a frequency-selective element disposed in at least one of the free-radiating regions. Preferably, the frequency-selective element is a Bragg grating.

In accordance with yet an additional feature of the invention, there is provided an imaging optical element disposed in at least one of the free-radiating regions.

In accordance with again another feature of the invention, a cylindrical lens is expediently disposed in the free-radiating region between the individual broad-stripe diode lasers, the focal line of which lens lies along the exit edge of the laser radiation from the broad-stripe laser.

By such a configuration, the fundamental mode of the emerging light beam is optimally concentrated and directed into the respectively adjacent active zone.

In accordance with again a further feature of the invention, two broad-stripe lasers are formed in a substrate. An unpumped region is present in the substrate between the two broad-stripe lasers, the region being dimensioned such that higher modes can leave the active zone, and, thus, the amplification region, on account of the lateral waveguide being absent there. The fundamental mode alone is able to traverse the unpumped region and, on the opposite side, again enter the active zone of the opposite broad-stripe laser. As a result, the threshold current condition for higher modes is raised very greatly, so that the broad-stripe laser oscillates predominantly in the fundamental mode.

In accordance with again an added feature of the invention, the device has two surface-emitting lasers, which are disposed at a distance in each case with an antireflection-coated top side facing one another.

The use of two surface-emitting lasers with only one mirror in each case makes it possible to reduce the electrical resistance of each surface-emitting laser to approximately one half. Moreover, the spacing between the surface-emitting lasers enables higher modes that are emitted at a larger solid angle than the fundamental mode to leave the resonator and no longer to be amplified so that the device substantially oscillates only in the fundamental mode.

In accordance with again an additional feature of the invention, at least one of the broad-stripe lasers have an exit window and an active zone defining an active zone plane, and an imaging optical element is disposed in at least one of the free-radiating regions and is a cylindrical lens having a focal line lying in the active zone plane at the exit window.

In accordance with still another feature of the invention, at least one of the free-radiating regions is formed of a medium having a low absorption coefficient.

In accordance with still a further feature of the invention, there is provided a substrate. The lasers are formed on the substrate. At least one of the free-radiating regions is formed of a medium having an absorption coefficient less than the substrate.

In accordance with still an added feature of the invention, the pump zone has a band gap and at least one of the free-radiating regions is formed of a section having a band gap greater than the band gap in the pump zone.

In accordance with still an additional feature of the invention, the pump zone has a band gap, the semiconductor lasers are two broad-stripe lasers disposed at a distance from one another and have antireflection-coated end faces facing one another, and at least one of the free-radiating regions is formed of a section with a band gap greater than the band gap in the pump zone.

With the objects of the invention in view, in a semiconductor laser, there is also provided a an emission device for emitting laser radiation, including a resonator and a pumped active zone disposed within the resonator, the zone being subdivided into at least two spatially separated active zones by free-radiation regions without lateral wave guidance.

Other features that are considered as characteristic for the invention are set forth in the appended claims.

Although the invention is illustrated and described herein as embodied in a multipartite laser, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
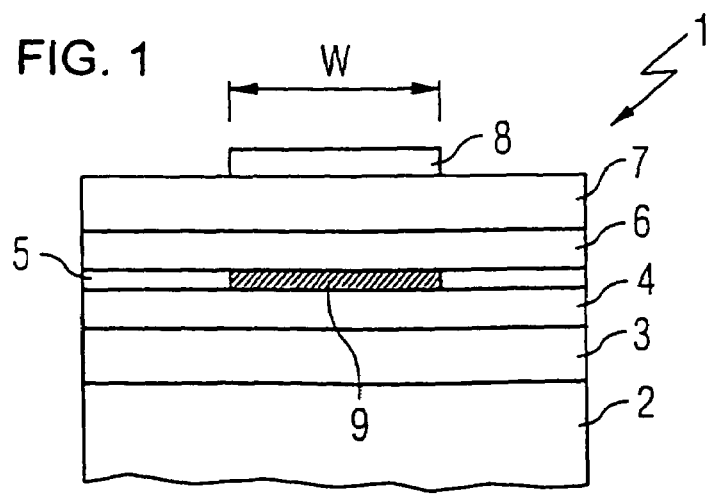
FIG. 1 is a fragmentary cross-sectional view of a broad-stripe laser according to the invention formed in a substrate.

Referring now to the figures of the drawings in detail and first, particularly to FIG. 1 thereof, there is shown cross-section through a broad-stripe laser 1. A lower barrier layer 3 is applied to a substrate 2. The barrier layer 3 has, for example, the composition $Al_{0.6}Ga_{0.4}As$ and a thickness of 1 μm. The lower barrier layer 3 is adjoined by a lower waveguide layer 4, which usually has the composition $Al_{0.3}Ga_{0.7}As$ and is about 0.5 μm thick. The light emitted by the broad-stripe laser 1 is generated in an active layer 5, which merely has a thickness of 10 nm and forms a quantum well. The material composition of the active layer depends on the desired wavelength of the emitted light. The active layer is usually composed of $Al_xIn_yGa_{1-x-y}As$, where $0 \leq x \leq 0.3$ and $0.05 \leq y \leq 0.3$. Situated above the active layer 5 is an upper waveguide layer 6 covered by an upper barrier layer 7. The thickness and the composition of the upper waveguide layer 6 and of the upper barrier layer 7 in each case correspond to the thickness and composition of the lower barrier layer 3 and lower waveguide layer 4. A broad-stripe contact 8 is formed on the upper barrier layer 7 and, together with a rear-side contact disposed on the rear side of the substrate 2, supplies the active layer 5 with current. In such a case, the spatial extent of the broad-stripe contact 8 determines the extent of a light-emitting active zone 9 in the active layer 5.

Figure 2:
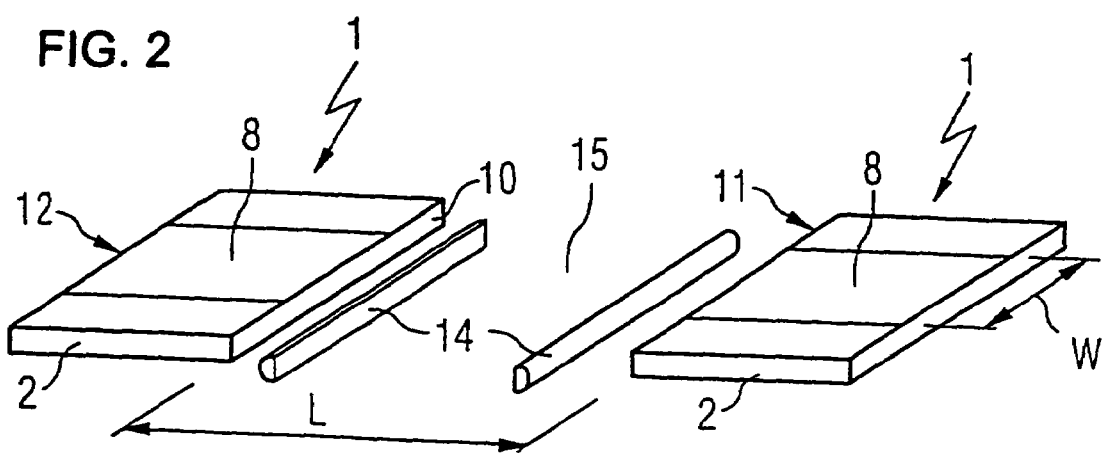
FIG. 2 is a perspective view of a laser configuration according to the invention with two opposite broad-stripe lasers with cylindrical lenses.

The broad-stripe lasers 1 illustrated in FIG. 2 are distinguished by having a high power and a long lifetime. However, the beam quality of individual broad-stripe lasers is usually poor because the broad-stripe laser 1 does not only oscillate in one mode and does not oscillate exclusively in the fundamental mode so that the laser radiation is emitted in a wide angular range.

Therefore, it is proposed to dispose at least two broad-stripe lasers 1 at a distance in a row or a line one behind the other such that only the fundamental mode of a respective broad-stripe laser 1 couples into the pumped active zone 9 of an adjacent broad-stripe laser 1. The higher-order modes, on account of their greater divergence, only partially enter the active zone 9 of adjacent broad-stripe lasers and are, therefore, amplified only slightly in comparison with the fundamental mode. As a result, the threshold current condition for higher modes is raised very greatly so that the laser configuration predominantly oscillates in the fundamental mode.

Figure 3:
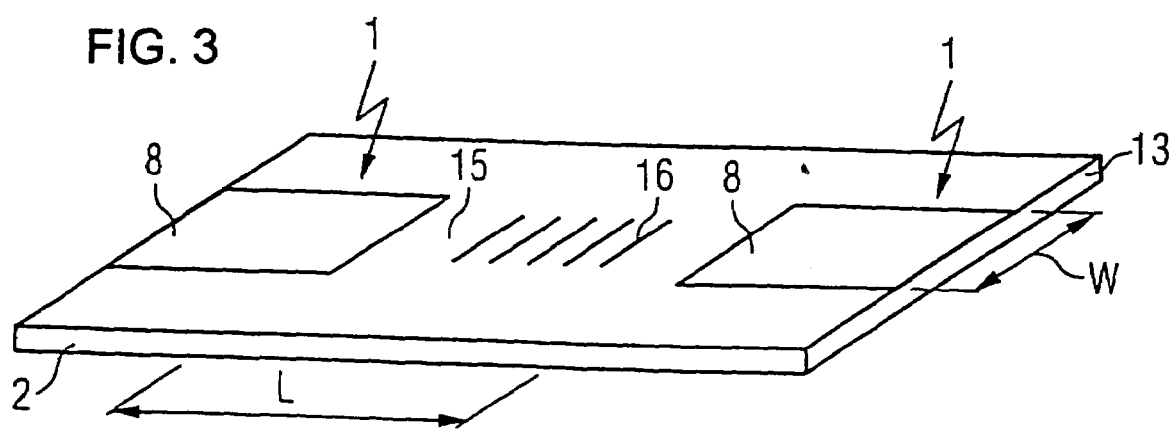
FIG. 3 is a perspective view of a laser configuration according to the invention with two opposite broad-stripe lasers formed in a substrate.

FIG. 3 illustrates an exemplary embodiment with two broad-stripe lasers respectively disposed at a distance L. The length of the path may be between 1 μm and 10 m. To couple the broad-stripe lasers 1 to form a laser configuration, the mutually facing facets 10 and 11 in each case (see FIG. 2) have a reflectivity relative to the radiation energy of less than 1%. At least one of the outer facets 12 and 13 has a reflectivity of greater than 90%, and the other has a reflectivity of 40%, for example. The outer facets, thus, form a resonator, the facets 12 and 13 performing the function of the mirror areas.

In order also to produce the divergence of the fundamental mode in the direction of the normal to the active zone 9, that is to say, at right angles to the active zone 9, cylindrical lenses 14 are provided (see FIG. 2), the focal line of which, preferably, runs along the exit edge of the active zone 9 at the inner facets 10 and 11. The cylindrical lenses 14 reduce the divergence—which is large on account of diffraction—of the fundamental mode in the direction of the normal to the active layer 5, or even collimate the light in the direction. By virtue of such a configuration, the fundamental mode is virtually completely coupled into the adjacent broad-stripe laser 1 and the laser threshold for the fundamental mode is, thereby, lowered.

It is also conceivable, as illustrated in FIG. 3, to form the broad-stripe lasers 1 on a common substrate 2 with a common layer construction. In such a case, it is not absolutely necessary to etch out the free-radiating region 15. It suffices for the absorption of the material to be reduced in the free-radiating region. This may be achieved, for example, by a local thermal treatment of the free-radiating region, by which aluminum indiffuses into the active layer 5 from the waveguide layers 4 and 6 adjoining the active layer 5 and/or indium outdiffuses from the active layer. This is because this increases the band gap of the active layer in the free-radiating region 15 so that the photons emitted by the active zones 9 are not absorbed in the free-radiating region.

If the laser configuration from FIG. 3 is intended to oscillate only at a specific frequency, it is advantageous if a frequency-selective element, for example, a Bragg grating 16, is introduced in the free-radiating region. Such Bragg gratings 16 are known to the person skilled in the art and are, therefore, not described herein with any further detail.

Figure 4:
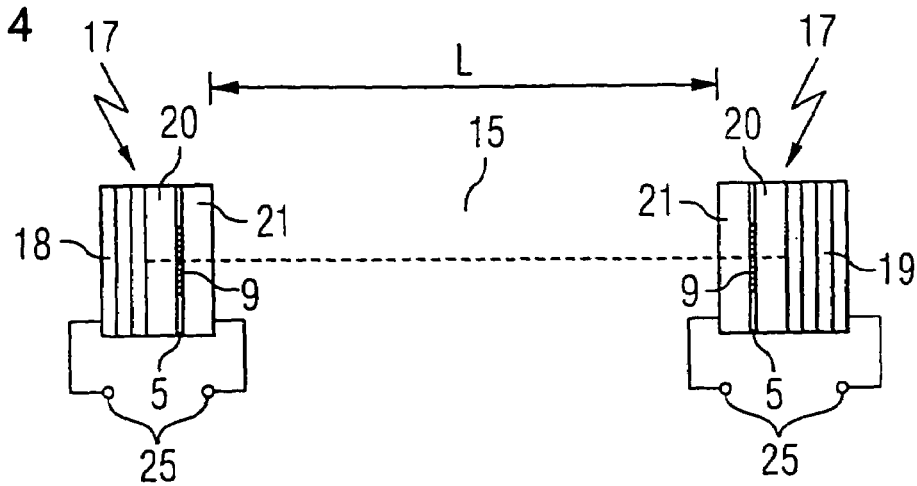
FIG. 4 is a cross-sectional view of a laser configuration according to the invention with two opposite surface-emitting lasers.
Figure 5:
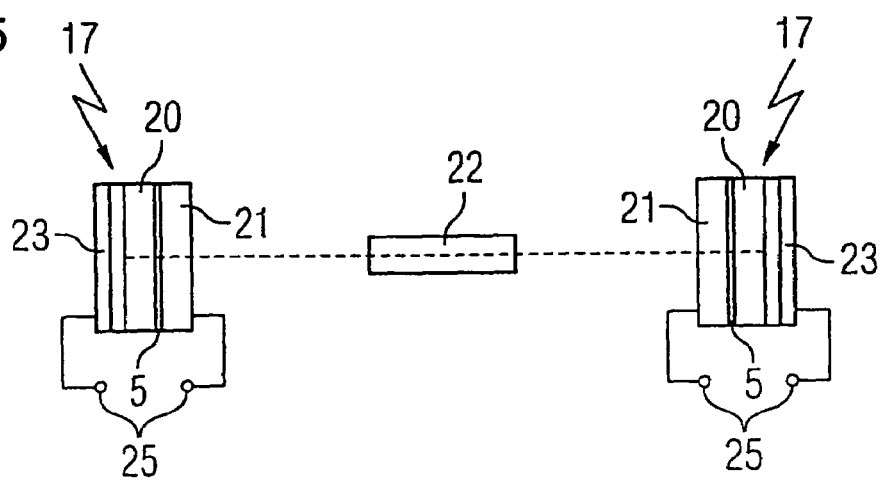
FIG. 5 is a cross-sectional view of a further modified laser configuration according to the invention with two opposite surface-emitting lasers.
Figure 6:
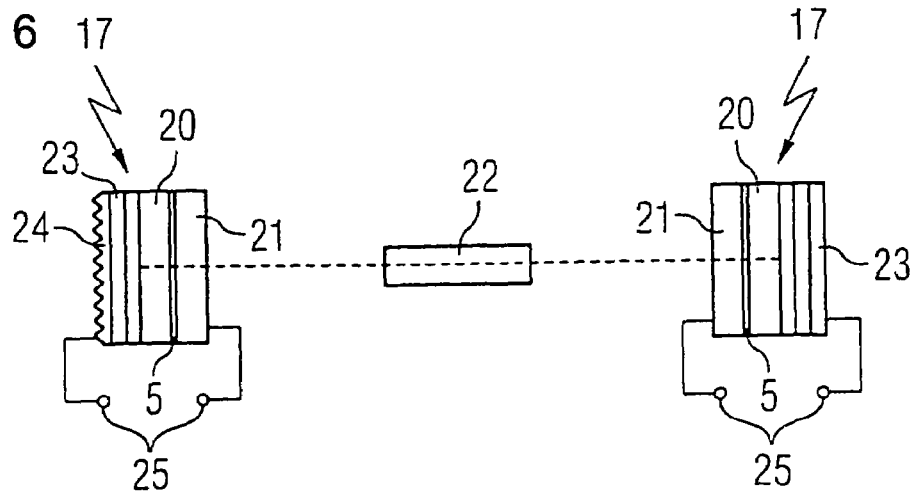
FIG. 6 is a cross-sectional view of a further modified embodiment of the laser configuration of FIG. 5.

FIGS. 4 to 6 illustrate further exemplary embodiments in which the laser configuration has two opposite surface-emitting lasers 17. The surface-emitting lasers 17 are also referred to as VCSEL or VECSEL. The surface-emitting lasers have rear-side Bragg mirrors 18 and 19, one of which has a reflectivity of close to 100% and the other has a reflectivity in the region of <99%. A lower intermediate layer 20 is applied to the Bragg mirrors 18 and 19, the active layer 5 adjoining the intermediate layer 20. The active layers 5 are, in turn, covered by an upper intermediate layer 21. The Bragg mirrors 18 and 19 are usually produced on the basis of AlGaAs layers. The intermediate layers 20 and 21 and also the active layers 5 are based on the material system AlGaInAs already mentioned.

The surface-emitting lasers 17 are disposed at a distance of 1 μm to 10 m. The large distance between the two surface-emitting lasers 17 has the effect that only the fundamental mode is guided in the resonator formed by the two Bragg mirrors 18 and 19, and that higher-order modes that are emitted at large solid angles by the surface-emitting lasers 17 leave the resonator and are no longer amplified. Therefore, the two surface-emitting lasers 17 have to be aligned such that the fundamental mode is in each case imaged into the active layer 5 of the opposite surface-emitting laser 17.

FIG. 5 illustrates a further exemplary embodiment, in which an optical element 22 is introduced into the free-radiating region 15 between the two surface-emitting lasers 17. The optical element 22 may have imaging properties to ensure that the fundamental mode of one respective surface-emitting laser 17 is imaged into the active layer 5 of the respective other surface-emitting laser 17. However, the optical element 22 may also serve for laterally coupling out part of the radiation generated by the laser configuration from the free-radiating region 15. In such a case, the surface-emitting lasers 17 may each be equipped with a Bragg mirror 23 having a reflectivity of almost 100%.

Finally, it should be noted that, as illustrated in FIG. 6, one or both of the Bragg mirrors 18, 19 and 23 may be provided with a metallization layer 24.

For the operation of the surface-emitting lasers 17, a supply voltage is applied to terminals 25.

The laser configuration with two surface-emitting lasers as illustrated in FIGS. 4 to 6 also has the advantage, in addition to the low beam divergence of the laser beam generated, that the surface-emitting lasers 17 can dispense with the Bragg mirror that is usually disposed on the upper intermediate layer 21 in conventional surface-emitting lasers. Because the upper Bragg mirror can be dispensed with, the surface-emitting lasers 17 have an electrical resistance that is reduced to approximately one half or less compared with conventional surface-emitting lasers. The power loss that occurs in the surface-emitting laser 17 on account of the internal resistance is correspondingly lower.

Furthermore, it should be noted that the laser configuration could also be realized in other material systems. By way of example, the material system based on AlGaInN is suitable for emission of laser radiation in the blue-green wavelength range. The material systems InGaAlP and GaAs are suitable for emission of laser radiation in the red wavelength range. Furthermore, II-VI compound semiconductors such as, for example, from the system CdBeMgZn, SeTe and SSeTeO are also suitable.

The scope of protection of the invention is not limited to the examples given herein. The invention is embodied in each novel characteristic and each combination of characteristics, which includes every combination of any features that are stated in the claims, even if this combination is not explicitly stated in the claims.

We claim:

1. A device for emission of laser radiation, comprising:
   at least one semiconductor laser having:
      a resonator; and
      a pumped active zone disposed within said resonator, said zone being subdivided into at least two spatially separated active zones by free-radiation regions without lateral wave guidance, a respective said separated active zone appears at a sufficiently small solid angle from an opposite, further respective said separated active zone, so that higher modes of said resonator experience a smaller amplification per resonator circulation than a fundamental mode of said resonator.

2. The device according to claim 1, wherein:
   said at least one semiconductor laser is at least two semiconductor lasers;
   said semiconductor lasers:
      have at least one end;
      are disposed in series; and
      have sides and an antireflection-coating at least on one of said sides;
   said semiconductor lasers have outer mirror elements at said end of said semiconductor lasers disposed in series; and
   said outer mirror elements forms said resonator.

3. The device according to claim 2, wherein said semiconductor lasers are two surface-emitting lasers disposed at a distance from one another and have antireflection-coated top sides facing one another.

4. The device according to claim 2, wherein said semiconductor lasers are two surface-emitting lasers disposed at a distance from one another;
said lasers have antireflection-coated top sides; and
said top sides face one another.

5. The device according to claim 2, wherein said semiconductor lasers are two broad-stripe lasers disposed at a distance from one another and have antireflection-coated end faces facing one another.

6. The device according to claim 2, wherein said semiconductor lasers are two broad-stripe lasers disposed at a distance from one another;
said lasers have antireflection-coated end faces; and
said end faces face one another.

7. The device according to claim 5, wherein said lasers have a substrate and are formed on said substrate.

8. The device according to claim 5, further comprising a substrate, said lasers being formed on said substrate.

9. The device according to claim 2, wherein said semiconductor lasers have optical axes and said semiconductor lasers are oriented with said optical axes parallel to one another.

10. The device according to claim 2, wherein said semiconductor lasers are disposed from one another at a distance between approximately 1 μm and approximately 10 m.

11. The device according to claim 9, wherein said semiconductor lasers are disposed from one another at a distance between approximately 1 μm and approximately 10 m.

12. The device according to claim 1, further comprising a frequency-selective element disposed in at least one of said free-radiating regions.

13. The device according to claim 12, wherein said frequency-selective element is a Bragg grating.

14. The device according to claim 1, further comprising an imaging optical element disposed in at least one of said free-radiating regions.

15. The device according to claim 5, wherein:
at least one of said broad-stripe lasers have an exit window and an active zone defining an active zone plane; and
an imaging optical element is disposed in at least one of said free-radiating regions and is a cylindrical lens having a focal line lying in said active zone plane at said exit window.

16. The device according to claim 1, wherein at least one of said free-radiating regions is formed of a medium having a low absorption coefficient.

17. The device according to claim 1, further comprising a substrate, said lasers being formed on said substrate, at least one of said free-radiating regions being formed of a medium having an absorption coefficient less than at least one of the group consisting of an adjoining region and said substrate.

18. The device according to claim 5, wherein:
said pump active zone has a band gap; and
at least one of said free-radiating regions is formed of a section having a band gap greater than said band gap in said pump active zone.

19. The device according to claims 16, wherein:
said pump active zone has a band gap;
said semiconductor lasers are two broad-stripe lasers disposed at a distance from one another and have antireflection-coated end faces facing one another; and
at least one of said free-radiating regions is formed of a section with a band gap greater than said band gap in the pump active zone.

20. The device according to claims 17, wherein:
said pump active zone has a band gap;
said semiconductor lasers are two broad-stripe lasers disposed at a distance from one another and have antireflection-coated end faces facing one another; and
at least one of said free-radiating regions is formed of a section with a band gap greater than said band gap in the pump active zone.

21. In a semiconductor laser, an emission device for emitting laser radiation, comprising:
a resonator; and
a pumped active zone disposed within said resonator, said zone being subdivided into at least two spatially separated active zones by free-radiation regions without lateral wave guidance, a respective said separated active zone appears at a sufficiently small solid angle from an opposite, further respective said separated active zone such that higher modes of said resonator experience a smaller amplification per resonator circulation than a fundamental mode of said resonator.

* * * * *

UNITED STATES PATENT AND TRADEMARK OFFICE
CERTIFICATE OF CORRECTION

PATENT NO. : 7,260,129 B2  Page 1 of 1
APPLICATION NO. : 10/774727
DATED : August 21, 2007
INVENTOR(S) : Martin Behringer et al.

It is certified that error appears in the above-identified patent and that said Letters Patent is hereby corrected as shown below:

On the title page:
Item (56) should read:

(56)  References Cited

U.S. PATENT DOCUMENTS

| | | | | |
|---|---|---|---|---|
| 4,622,671 | A |   | 11/1986 | Tsang |
| 4,805,185 | A | * | 2/1989 | Smith .....................372/97 |
| 5,136,598 | A | * | 8/1992 | Weller et al. .............372/26 |
| 5,220,572 | A | * | 6/1993 | Kawaguchi ...............372/30 |
| 5,544,188 | A | * | 8/1996 | Takiguchi et al. .........372/45.01 |
| 5,568,498 | A |   | 10/1996 | Nilsson |
| 5,856,990 | A |   | 1/1999 | Nilsson |
| 6,580,850 | A |   | 6/2003 | Rudolf Kazarinov et al. ...385/028 |

Signed and Sealed this

Fourteenth Day of April, 2009

JOHN DOLL
*Acting Director of the United States Patent and Trademark Office*